(12) United States Patent
Shi

(10) Patent No.: US 11,054,284 B2
(45) Date of Patent: Jul. 6, 2021

(54) METHOD OF RATIOMETRIC PROXIMITY SENSING

(71) Applicant: The Boeing Company, Chicago, IL (US)

(72) Inventor: Fong Shi, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 213 days.

(21) Appl. No.: 16/532,499

(22) Filed: Aug. 6, 2019

(65) Prior Publication Data

US 2021/0041268 A1 Feb. 11, 2021

(51) Int. Cl.
*G01D 5/20* (2006.01)
*B64F 5/60* (2017.01)

(52) U.S. Cl.
CPC ............ *G01D 5/2006* (2013.01); *B64F 5/60* (2017.01)

(58) Field of Classification Search
CPC .......... G01D 5/20; G01D 5/2006; G01D 5/24; G01D 5/22; G01D 5/25; G01D 5/251; B64F 5/60; H03K 17/95; H03K 17/9502; H03K 17/952
See application file for complete search history.

(56) References Cited

U.S. PATENT DOCUMENTS

| | | | |
|---|---|---|---|
| 4,219,740 A | 8/1980 | Little | |
| 4,334,204 A | 6/1982 | Buchanan | |
| 5,142,235 A | 8/1992 | Matsumoto et al. | |
| 7,173,411 B1 | 2/2007 | Pond | |
| 7,358,720 B1 | 4/2008 | Maier | |
| 8,115,498 B1 | 2/2012 | Lumbab | |
| 9,803,999 B2 | 10/2017 | Stothers et al. | |
| 2003/0033927 A1 | 2/2003 | Bryant et al. | |
| 2018/0113005 A1 | 4/2018 | Selvaraj et al. | |

FOREIGN PATENT DOCUMENTS

| | | | | |
|---|---|---|---|---|
| DE | 1990-172723 | * | 6/1990 | ............... G01V 3/10 |
| EP | 2391009 A2 | | 11/2011 | |
| EP | 2391009 A3 | | 9/2014 | |

OTHER PUBLICATIONS

Extended European Search Report dated Dec. 16, 2020 in European Patent Application No. 20189140.5 (European counterpart to the instant U.S. patent application).

* cited by examiner

*Primary Examiner* — Son T Le
(74) *Attorney, Agent, or Firm* — Ostrager Chong Flaherty & Broitman, P.C.

(57) ABSTRACT

Systems and methods for measuring an operating current and an operating voltage of an inductive proximity sensor in an improved manner. The proposed method is to measure and process the sensing parameters in a ratiometric way. A proximity sensing electronics unit receives an input signal from a proximity sensor that was derived by dividing the sensor's current by the sensor's supply voltage which produces that operating current. The division result, i.e., the quotient, is properly scaled to represent the sensor's state. The circuitry ratiometrically determines its operation status by eliminating common mode effects and variations of sensor state thresholds, allowing additional sensing parameters and health status to be measured and monitored without extending the operational range of the sensor.

20 Claims, 6 Drawing Sheets

METHOD OF RATIOMETRIC PROXIMITY SENSING

BACKGROUND

This disclosure generally relates to systems and methods for indicating the proximity of two structural elements or components and, more particularly, to such a system in which an inductive sensor is mounted on a stationary component and a metal target is mounted on a deployable component (e.g., aircraft components).

Flight control involves movements of inboard and outboard flaps, slats, spoilers, ailerons and other control surfaces. Landing gears are retracted after takeoff and deployed during descent. When wheels touch the ground, the thrust reversers inside the engine nacelles turn on only after a weight-on-wheels state of the aircraft is confirmed. Positions and movements of the foregoing aircraft components are monitored using onboard proximity sensors and sensor electronics systems. Typically, proximity sensors are connected to the systems situated in the aircraft's electronic equipment bay by dedicated cables which run to various locations on the aircraft.

Electromagnetically inductive proximity sensors, due to their non-contact sensing principles, have been widely adopted by the aerospace industry instead of mechanically activated sensors that are based on physical contact. Inductive proximity sensors are of two types: passive and active. Typical inductive proximity sensors include an electrically conductive coil separated from a metal target by a gap. Alternating current passing through the coil generates a varying electromagnetic field. When a piece of metal target moves into the magnetic flux paths generated by the energized coil, the inductance of and the current flowing through the coil change to indicate the proximity of the target without physically contacting the target. The target may be made magnetically conductive material such as ferrous steel or nickel, or non-magnetically conductive material such as aluminum or copper.

A passive two-wire sensor contains only a coil whose inductance varies due to the presence of a metal target. Proximity Sensing Electronics Unit (PSEU) measures and interprets the changes of sensor's inductance to determine whether a target is near or far. PSEU can also detect cable-open and cable-short faults. An active sensor has a coil plus additional built-in electronics whose output indicates the target states of actuation or de-actuation, as seen in FIG. 1. Active two-wire sensors typically have high performance and immunity to both noise and variations of the cable lengths.

The sensing method for active proximity sensors is typically based on measuring the sensor's current in absolute magnitude. The amount of current varies in accordance with component tolerances, process variations and environmental effects. One solution (described in more detail below with reference to FIG. 1) is unable to detect any latent change of an actuation gap between a target and a sensor after initial installation. Over time in service, the actual positions of the sensor and target may have shifted away from their initially calibrated positions at factory. Nondeterministic sensor status may lead to ambiguities, incorrect instrument indications and cockpit confusions, control errors, system malfunctions, and also extra maintenance work on the ground. Any improvement over the existing configuration to detect any latent changes, eliminate ambiguities and resolve these problems would be beneficial.

SUMMARY

The subject matter disclosed in some detail below is directed to systems and methods for measuring an operating current and an operating voltage of an inductive proximity sensor in an improved manner. The proposed method is to measure and process the sensing parameters in a ratiometric way. In accordance with one embodiment, a proximity sensing electronics unit receives an input signal from a proximity sensor that was derived by dividing the sensor's current (hereinafter "operating current") by the sensor's supply voltage which produces that operating current. The division result, i.e., the quotient, is properly scaled to represent the sensor's state. The circuitry ratiometrically determines its operation status by eliminating common mode effects and variations of sensor state thresholds, allowing additional sensing parameters and health status to be measured and monitored without extending the operational range of the sensor.

The method proposed herein is an improvement to the existing airplane sensing systems without airplane configuration change. However, the proposed method of ratiometric sensing is not limited to onboard airplanes. Industrial applications for machining, heavy equipment and production lines widely employ inductive proximity sensors. The concept disclosed herein extends to all sensor applications that are based on sensing of absolute magnitude.

Although various embodiments of systems and methods for ratiometric proximity sensing will be described in some detail below, one or more of those embodiments may be characterized by one or more of the following aspects.

One aspect of the subject matter disclosed in detail below is a method for ratiometric proximity sensing comprising: supplying a supply voltage to a sensor via a sensor supply line; energizing a sensing coil of the sensor; measuring the supply voltage while the sensing coil is energized; measuring the sensor current while the sensing coil is energized; dividing the measured sensor current by the measured supply voltage to produce a signal representing a quotient; scaling the supply current of the sensor supply line by the quotient; monitoring the scaled supply current; decoding a status of the sensor in dependence on the magnitude of the scaled supply current; and determining an actuation status and a health status of the sensor based on results of the decoding. In accordance with one embodiment, the method further comprises adjusting the sensor current to compensate for variations in a temperature of the sensing coil before the sensor current is measured.

Another aspect of the subject matter disclosed in detail below is a system for ratiometric proximity sensing comprising a sensor and an electronics unit configured to supply a supply voltage to the sensor and monitor a sensor current of the sensor, wherein the sensor comprises: a supply circuit that is supplied with the supply voltage; a sensor coil that is connected to receive current from the supply circuit; current scaling circuitry that is configured for dividing the measured sensor current by the measured supply voltage to produce a signal representing a quotient and then scaling the supply current of the sensor supply line by the quotient; and a current setting circuit configured to provide the scaled sensor current to the supply circuit. The electronics unit is configured to monitor the scaled supply current and decode a status of the sensor in dependence on the magnitude of the scaled supply current. In accordance with one embodiment, the system further comprises a temperature compensation circuit that is configured to adjust the sensor current to compensate for variations in a temperature of the sensing coil.

A further aspect of the subject matter disclosed in detail below is a sensor comprising: a supply circuit that is supplied with the supply voltage; a reference circuit that is connected to receive power from the supply circuit; a sensor coil that is connected to receive current from the supply circuit; current scaling circuitry that is configured for dividing the measured sensor current by the measured supply voltage to produce a signal representing a quotient and then scaling the supply current of the sensor supply line by the quotient; and a current setting circuit configured to receive a reference current from the reference circuit and provide the scaled sensor current to the supply circuit.

In one proposed implementation of the sensor described in the immediately preceding paragraph, the current scaling circuitry comprises: first through fourth resistors; a multiplier having first and second inputs and an output, the first input of the multiplier being connected to receive the supply voltage; a first amplifier having first and second inputs and an output, the output of the first amplifier being connected to the second input of the multiplier and to the third resistor, and the first input of the first amplifier being connected to receive the sensor current via the first resistor and to receive a signal from the output of the multiplier via the second resistor; a second amplifier having first and second inputs and an output, the first input of the second amplifier being connected to the third resistor via a first junction, and the output of the second amplifier being connected to the current setting circuit via a second junction, wherein the fourth resistor bridges the first and second junctions; and a temperature compensation circuit that is configured to adjust the sensor current to compensate for variations in a temperature of the sensing coil, wherein the first resistor is connected to an output of the temperature compensation circuit.

Other aspects of systems and methods for ratiometric proximity sensing are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams briefly described in this section are drawn to scale.

Reference will hereinafter be made to the drawings in which similar elements in different drawings bear the same reference numerals.

DETAILED DESCRIPTION

For the purpose of illustration, systems and methods for ratiometric proximity sensing will now be described in some detail. However, not all features of an actual implementation are described in this specification. A person skilled in the art will appreciate that in the development of any such embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
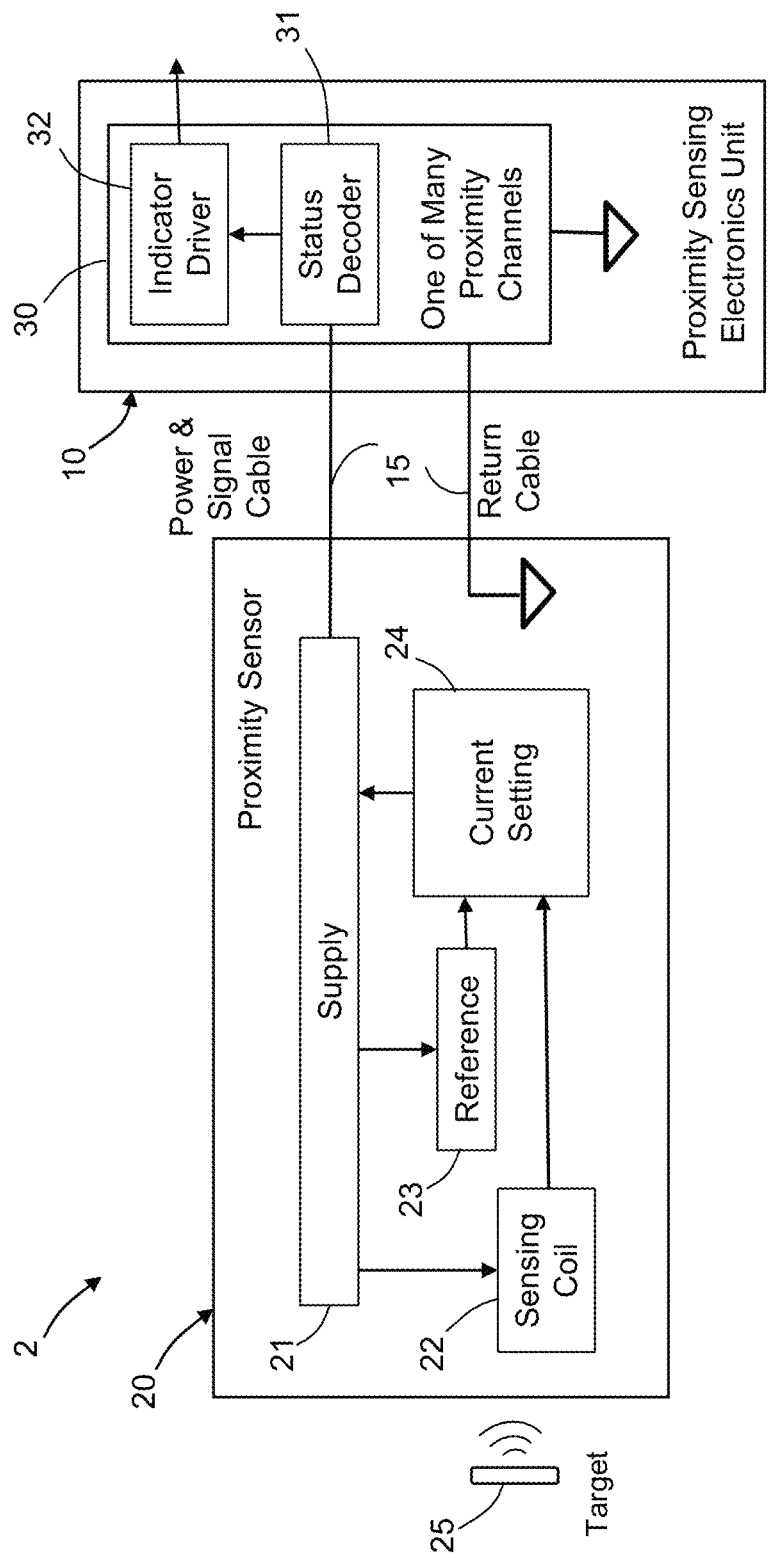
FIG. 1 is a block diagram identifying components of a proximity sensing system having a two-wire active switch configuration.

An existing sensing method for active proximity sensors is based on measuring the sensor's operating current in absolute magnitude. FIG. 1 is a block diagram identifying components of one example of such a proximity sensing system 2 having a two-wire active switch configuration, which arrangement is typical for proximity sensing on an aircraft. The proximity sensing system 2 includes a sensor 20 and a proximity sensing electronics unit 10 (hereinafter "PSEU 10"), which are operatively (electrically) coupled by means of a cable 15 having two wires. In accordance with some embodiments, the sensor 20 is in the form of an application-specific integrated circuit (ASIC). The PSEU 10 includes one or more processors or computers configured for performing the status decoding function, control functions, and interface functions.

In the example depicted in FIG. 1, the PSEU 10 provides a supply voltage to the sensor 20 and monitors the operating current of the sensor 20. The PSEU 10 has multiple channels 30 (only one of which is shown in FIG. 1), each channel 30 feeding to a respective sensor 20 via the cable 15. In aircraft applications, the length of cable 15 may be in a range from a few feet to more than one hundred feet. Channel 30 provides power to the sensor 20 while monitoring the sensor's operating current along the cable 15.

The sensor 20 includes a supply circuit 21, a sensing coil 22, a reference circuit 23 and a current setting circuit 24. The supply circuit 21 provides operating voltages to the sensing coil 22, reference circuit 23 and current setting circuit 24. The supply circuit 21 includes a voltage regulator that keeps the supply voltage to the sensor 20 as constant as possible. The reference circuit 23 includes a resistor that is biased under the regulated supply voltage. The reference circuit 23 generates a reference current for the sensing coil 22. The supply circuit 21 may further include a pulse generator for energizing the sensing coil 22.

The sensing coil 22 may receive either a current pulse or a direct current (DC) from the supply circuit 21. The current output from the sensing coil 22 will vary as a function of the relative position of a target 25 (made of metal). The current setting circuit 24 is electrically connected to receive operating current output by the sensing coil 22 and reference currents output by the reference circuit 23. The current setting circuit 24 is configured to compare the operating current output from sensing coil 22 with the reference currents output by reference circuit 23. The current setting circuit 24 adjusts the amount of current that will passed through the supply circuit 21 to the PSEU 10 depending on the magnitude of the gap distance separating a target 25 (e.g., made of metal) and the face of the sensor 20. The sensing status is calibrated (adjusted) and sent back to the PSEU 10 along the same wire of cable 15 that provides the voltage to sensor 20. The PSEU 10 includes a status decoder 31 that is configured to decode the status of the sensor 20 based on the current received from the sensor 20 and then initiate an indicator driver 32 to indicate the sensor status. The status decoder 31 may also initiate one or more control functions depending on the sensor status.

Figure 2:
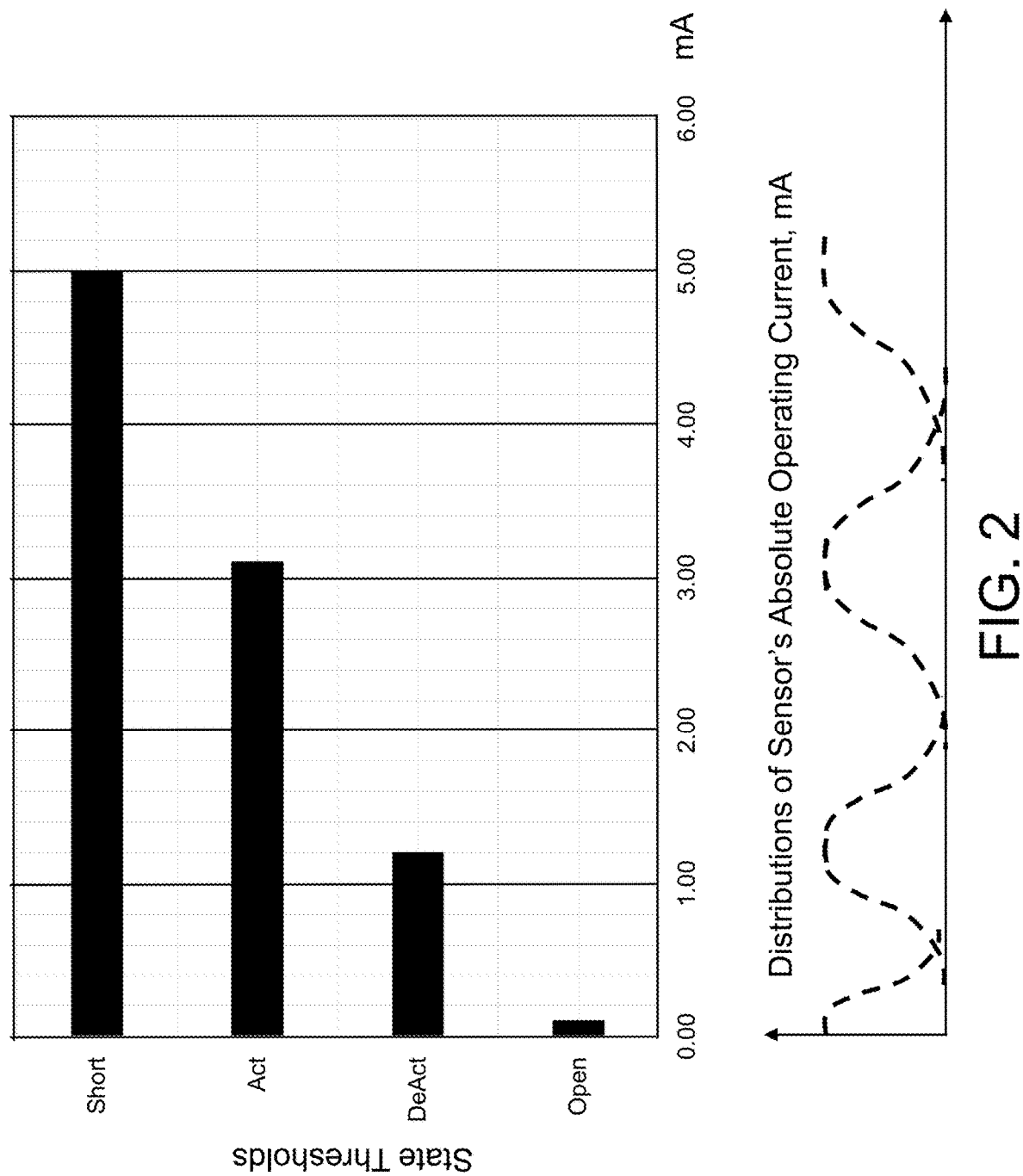
FIG. 2 is a hybrid diagram including a bar chart showing operating state thresholds for the sensor depicted in FIG. 1 and a graph showing distributions of absolute operating current corresponding to the respective operating state thresholds shown in the bar chart.

A typical proximity sensor of the type partly depicted in FIG. 1 has four states: Open Fault, De-actuation, Actuation and Short Fault. These sensor states are represented by corresponding magnitudes of sensor operating current in an ascending order. FIG. 2 is a hybrid diagram including a bar chart showing typical operating state thresholds for an active non-contact two-wire proximity sensor of the type depicted in FIG. 1 and a graph showing typical distributions of absolute operating current corresponding to the respective operating state thresholds shown in the bar chart. Due to process variations, component tolerances, and operating environment, the sensor's current magnitudes typically follow the Gaussian probability distributions shown in FIG. 2. Overlapped threshold regions from adjacent sensor states exist due to parts coming from different batches, different manufacturing dates and different production runs. For example, resistors fabricated on an ASIC may have a ±25% tolerance over production runs over time. In addition to the variations of supply voltage, this is also the cause of four bell-shaped distributions in variation shown in FIG. 2 as detection thresholds used by the PSEU 10. In addition, the resistance of the copper wires of the sensing coil 22 has its temperature dependency, which also adds to the variations of the sensor current. Because the variation regions may overlap, the existing method may produce nondeterministic results or even incorrect outcomes under certain conditions. For example, an actuation state may be improperly indicated as a de-actuation state or a short fault; or a de-actuation state may be misinterpreted as an actuation state or an open fault. If an in-flight event occurs, an incorrect status determination may cause system malfunction and confusion to the flight crew. For transient events occurring during flight, an incorrect status determination may produce a conclusion of No-Fault-Found on the ground during subsequent maintenance operations. In addition, due to constant airframe vibrations, frequent movements of the control surfaces and repeated shocks during aircraft landings, misalignment and displacement between the targets and sensors may develop over time. The actuation gap between the target piece and sensor face may change, thereby frustrating accurate determination of the sensor's status.

In short, notable drawbacks of a typical existing proximity sensing system are: (a) nondeterministic results may be caused by variations and overlaps of sensor parameters being measured by an absolute magnitude, which may in turn lead to ambiguities and false status; (b) misalignments between sensor and target which develop over time are not being monitored until they are physically damaged in service; and (c) existing onboard fault monitors are unable to report to the aircraft health monitoring systems in a timely manner.

The proximity sensing method proposed herein is to measure and process the sensing parameters in a ratiometric way. The input signal to PSEU 10 is the sensor current. That sensor current is divided by the sensor's supply voltage which produces that sensor current. The division result, i.e., the quotient, is properly scaled to represent the sensor's state.

Figure 3:
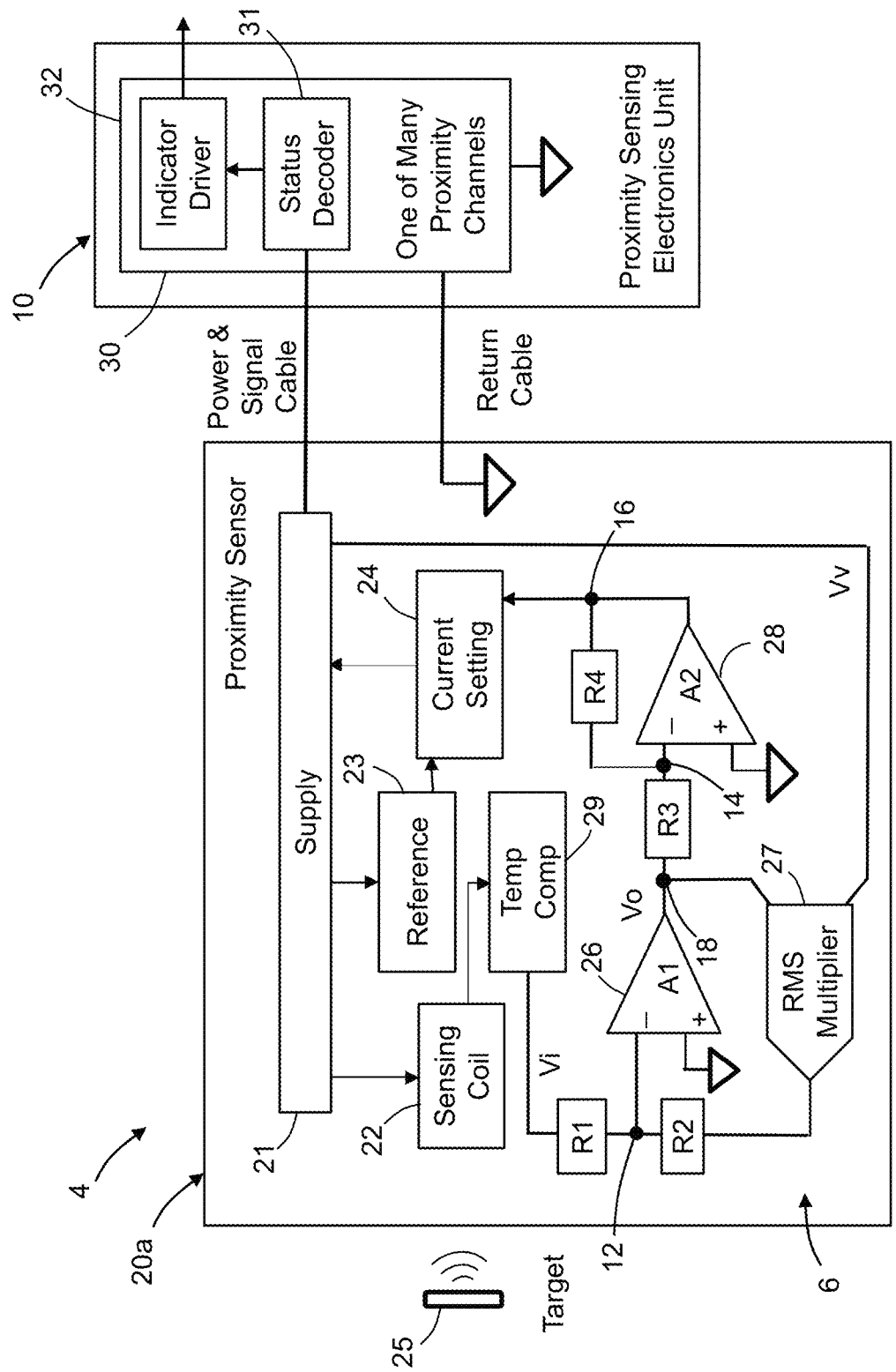
FIG. 3 is a block diagram identifying components of an improved proximity sensing system in accordance with one embodiment.

FIG. 3 is a block diagram identifying components of a ratiometric proximity sensing system 4 in accordance with one embodiment. The proximity sensing system 4 includes a sensor 20a which improves upon on sensor 20 partly depicted in FIG. 1. The proximity sensing system 4 further includes PSEU 10, which is operatively (electrically) coupled by means of cable 15 to the sensor 20a. (Elements indicated by the same reference numbers in FIGS. 1 and 3 have similar if not identical functions, which functions have already been described with reference to FIG. 1.

The sensor 20a partly depicted in FIG. 3 includes a temperature compensation circuit 29 provides suitable temperature compensations to the current of the sensing coil 22. Thus, the variations in operating current due to temperature-induced changes to the resistance of copper wires of the sensing coil 22 are compensated for. The sensor 20a further includes current scaling circuitry 6 which is configured to alter the temperature-compensated current from the sensing coil 22 ratiometrically. The current scaling circuitry 6 includes one multiplier 27, four resistors R1-R4 and two amplifiers 26 and 28 (hereinafter "amplifiers A1 and A2") wired in two feedback loops. These components may be implemented on the same ASIC having the supply circuit 21, the reference circuit 23 and the current setting circuit 24.

The temperature-compensated current signal is fed to an inverting input of amplifier A1 through a resistor R1 and a junction 12. The supply circuit 21 feeds a voltage Vv to a first input of multiplier 27 to be multiplied with the output voltage Vo of amplifier A1. The current output by amplifier A1 is fed to a second input of multiplier 27 through a junction 18. In accordance with one embodiment, the multiplier 27 is a root-mean-square (RMS) multiplier. The output of the multiplier 27 is fed to the same inverting input of amplifier A1 through a resistor R2 and junction 12. The resistances of resistors R1 and R2 of the same or different values may be implemented in the ASIC as an identically matched pair both of materials and layout orientations. At the inverting input of amplifier A1, Vi/R1+VoVv/R2=0; Vo=−(R2/R1) (Vi/Vv).

The output from amplifier A1 is fed to the inverting input of amplifier A2 through junction 18, a scaling resistor R3 and a junction 14. The output of amplifier A2 is operatively (electrically) coupled to the current setting circuit 24 through a junction 16. A scaling resistor R4 bridges the junctions 14 and 16. Scaling resistors R3 and R4 are also made of the same materials and same layout orientations. With different values, the resistances of scaling resistors R3 and R4 are properly scaled for the sensing range. Although the properly scaled output of the current setting circuit 24 is in the form of supply current being sent back to be decoded by PSEU 10, sensor status is actually represented by the values of admittance that have been ratiometrically determined.

Resistors are made along with the transistors on the same chip. The problem is the variations of those resistors all fabricated at the same time on the same wafer during fabrications. From batch to batch in production runs over time, resistors on an integrated circuit (chip) can vary by ±25% or more. Typically, however, all resistor values go up on the same chip or go down on the same chip. As an example, if resistors R1 and R2 are designed as 30 kΩ and 10 kΩ respectively, the actual resistances of R1 and R2 can be 37.5 kΩ and 12.5 kΩ, or 22.5 kΩ and 7.5 kΩ within that ±25% window. Thus, in ratiometric operation, the ratio remains constant (e.g., 3). The ASIC can operate ratiometrically as an improvement over existing proximity-sensing integrated circuits. In addition, existing proximity-sensing integrated circuits may be retrofitted to include the ratiometric configuration of electrical components including temperature compensation circuit 29, resistors R1-R4, amplifiers A1 and A2, and multiplier 27.

Figure 4:
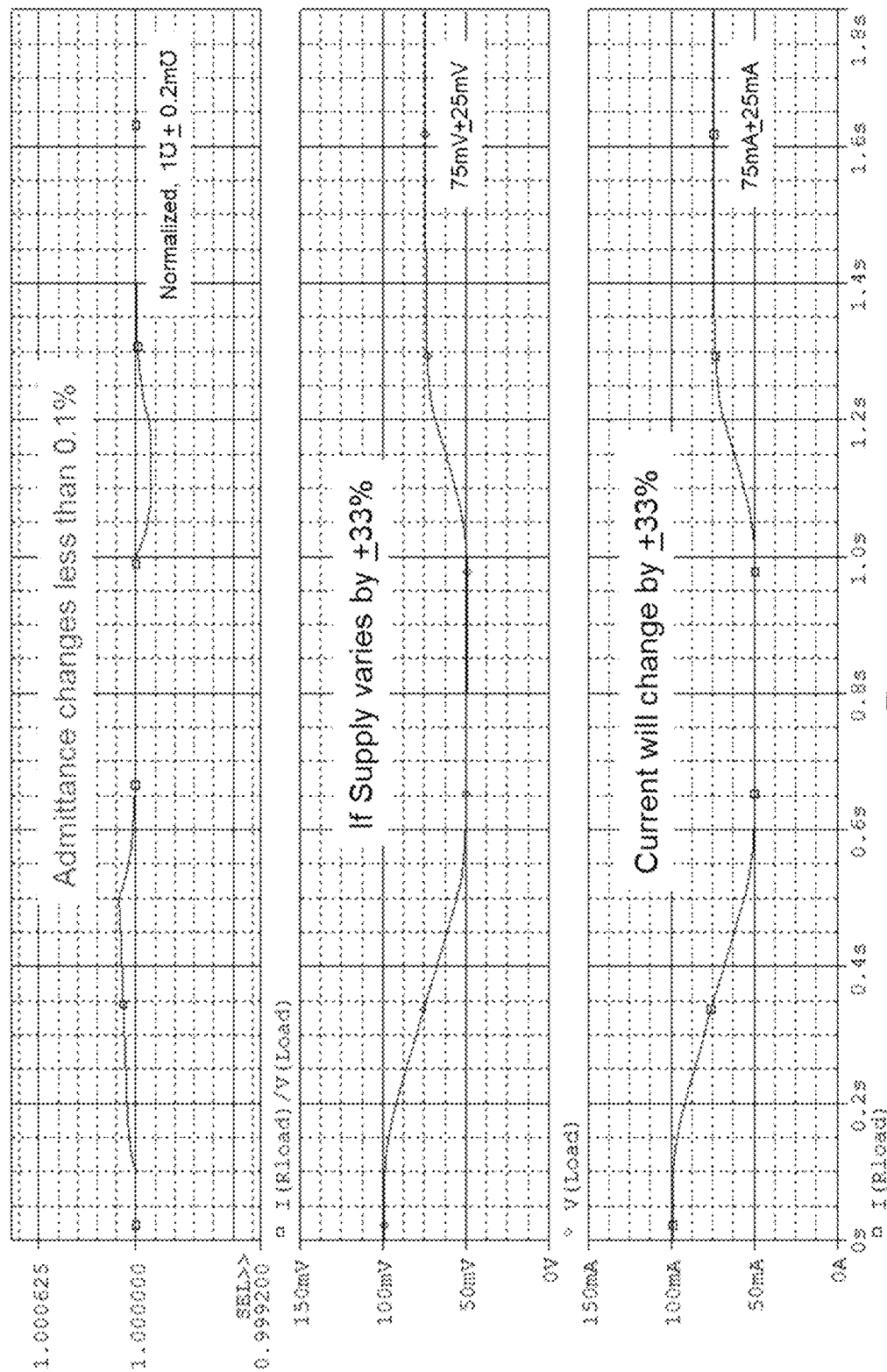
FIG. 4 includes three graphs which respectively show one example of a variation of a supply voltage over time (middle graph), a variation of admittance over time (upper graph) due to the variation in supply voltage and a variation of current over time (lower graph) due to the variation in supply voltage.
Figure 5:
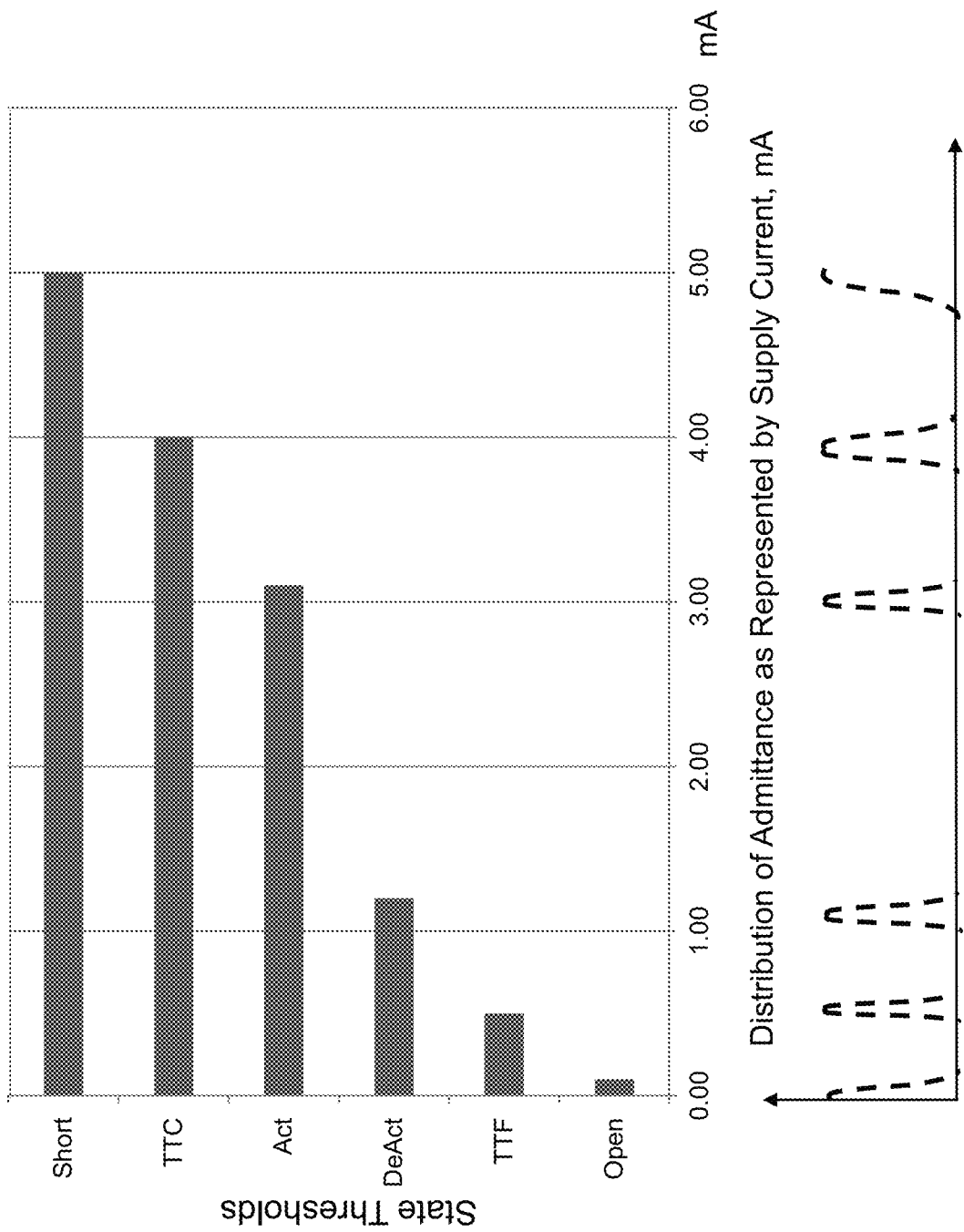
FIG. 5 is a hybrid diagram including a bar chart showing operating state thresholds for the improved sensor depicted in FIG. 3 and a graph showing a distribution of admittance as represented by the supply current.

The ratiometric sensing method disclosed herein has been analyzed by simulation. To view the ratiometric effect, run time becomes irrelevant. The results of one simulation based on fluctuations of supply voltage alone are presented in FIG. 4, which includes three graphs which respectively show one example of a variation of a supply voltage over time (middle graph), a variation of admittance over time (upper graph) due to the variation in supply voltage and a variation of current over time (lower graph) due to the variation in supply voltage. The regulator inside the ASIC can be a rudimentary type. FIG. 4 shows that if supply voltage varies by ±33%, the operating current of absolute magnitude will follow the rate accordingly. However, the corresponding variation of a ratiometrically produced quotient, presented as admittance in this case, is less than 0.1%, i.e., negligible due to cancellation of common mode effects. As seen by the PSEU 10, similar to the cancellation of resistors' variations on a chip, effects due to supply variations are cancelled, common mode effects and environmental variations are minimized if not all nulled in real applications. The proposed method improves the performance by tightening the Gaussian distributions of the state thresholds and eliminating common mode effects, thus allowing more accurate position sensing and status decoding. FIG. 5 shows an improved performance as compared to FIG. 2.

The innovative method disclosed herein is capable of monitoring the actual distance between the target 25 and the sensor 20a, and reporting additional status for target positions and sensor health. Specifically, a state of TTC (target-too-close) can be placed between the sensor's Actuation and Short Fault states; another state of TTF (target-too-far) can be placed between the De-actuation and Open Fault states. In between actuation and de-actuation, more precise measurement of the gap distance can be obtained. Introducing these additional states enables an onboard system to include additional sensor's health conditions and solve the previously mentioned problems that the solution depicted in FIG. 1 cannot solve.

Figure 6:
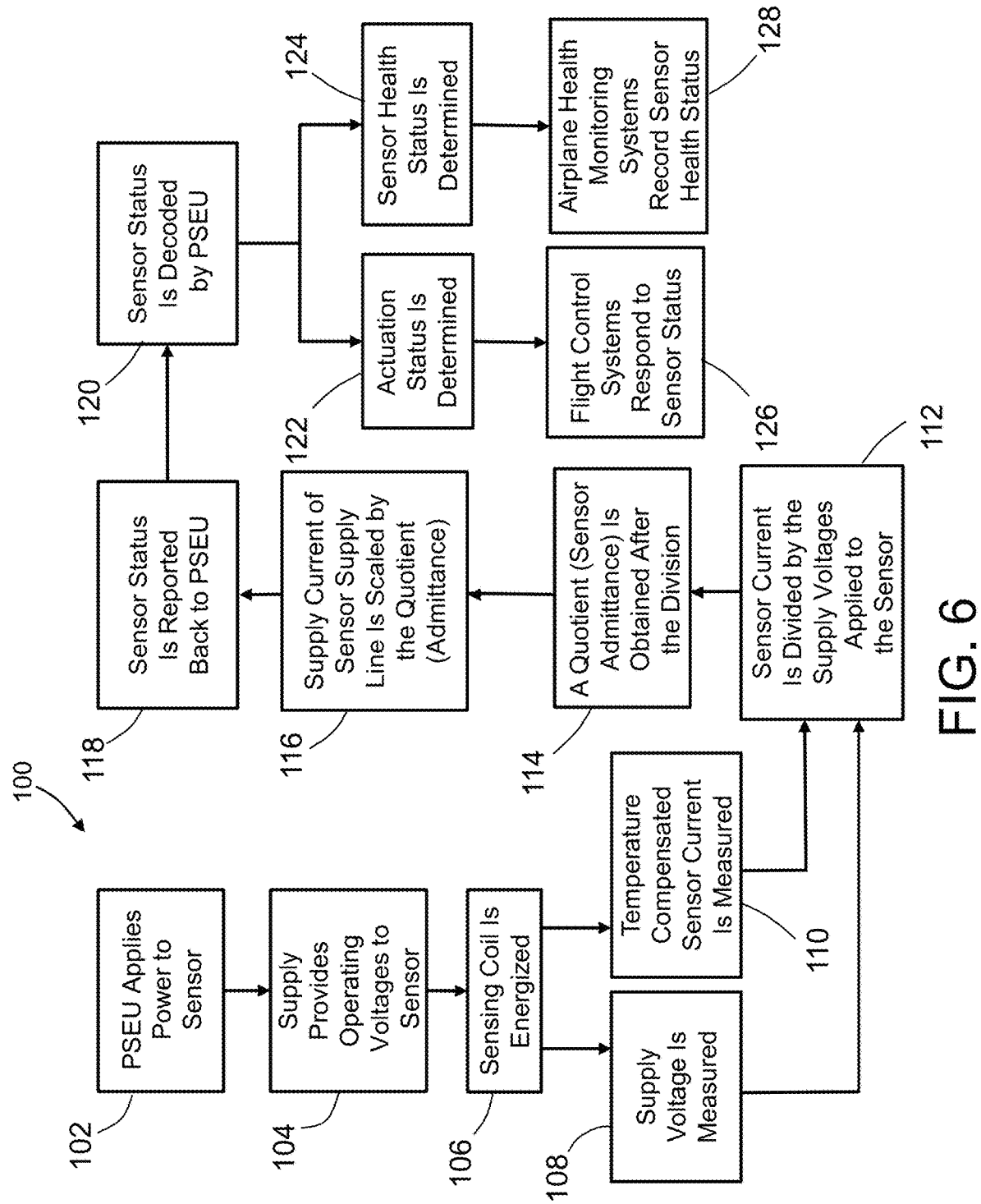
FIG. 6 is flowchart identifying steps of a method for ratiometric proximity sensing in accordance with one embodiment.

FIG. 6 is flowchart identifying steps of a method 100 for ratiometric proximity sensing in operation in accordance with one embodiment. The PSEU 10 supplies power to the sensor 20a (step 102). The supply circuit 21 then provides operating voltages to the sensor components (step 104). Upon receipt of direct current or a current pulse from supply circuit 21, the sensing coil 22 is energized (step 106). When a piece of metal target moves into the magnetic flux paths generated by the energized coil, the inductance of and the current flowing through the sensing coil 22 change to indicate the proximity of the target 25 without physical contact. To enable ratiometric sensing, the supply voltage is measured (step 108) and the temperature-compensated sensor current is measured (step 110). Then the sensor current is divided by the supply voltage applied to the sensor 20a (step 112). A quotient (sensor admittance) is obtained after the division (step 114). The supply current of the sensor supply line is scaled by the quotient (admittance) (step 116). The sensor status is reported back to the PSEU 10 (step 118). More specifically, the PSEU 10 monitors the current being drawn by the sensor 20a. The PSEU 10 then decodes the sensor status (step 120). Based on the decoding results, the actuation status is determined (step 122) and the sensor health status is determined (step 124) by respective processors or software modules (incorporated in PSEU 10) executing respective algorithms. The flight control systems of the aircraft respond to the sensor status (step 126). The aircraft health monitoring systems record the sensor health status in a non-transitory tangible computer-readable storage medium (step 128). Without further extending the operating ranges for sensors and PSEU detection, more sensing states representing the gap distance, positions of the target-sensor pair, and sensor's health monitoring can be implemented.

For the purpose of illustration, the following design example is provided. Assume that in the sensor 20 partly depicted in FIG. 1, a change from the de-actuation state to the actuation states produces changes of 100 μA and 300 mV under 6 Vdc bias. For the current detection scheme, 100 μA gets lost against noise picked up over long cables, so one 30 kΩ resistor in reference circuit 23 converts 100 μA to 3 V, which is scaled to 3 mA via cable 15 and seen by the status decoder 31 of PSEU 10. One such ASIC is used for many types of sensors of different coil diameters and geometries. Scaling and calibration of such current for each type are a part of the procedures during manufacturing, installation and rigging tests.

The proposed proximity sensing system 4 partly depicted in FIG. 3 is also capable of sending the same 3 mA actuation current back to PSEU 10, using the same 6-V supply, as a design example. Let the resistances be as follows: R1=1 kΩ, R2=10 kΩ, R3=2 kΩ and R4=12 kΩ. With the same diffusion materials and same orientations, the meandering path in length of resistor R2 is 10× equivalent of that of resistor R1, while that of resistor R4 is 6× that of resistor R3. This is how matching is accomplished by ASIC design. Depending on current density in layout squares, the R1/R2 pair can be different from the R3/R4 pair, as long as two corresponding ones are of one pair. Further assume that a 300 mV signal change is temperature compensated for copper coils having a temperature coefficient of +0.4%/° C. At the amplifier A1 output, Vo=−(10 kΩ/1 kΩ)(0.3 V/6 V)=−0.5 via amplifier A1's feedback loop. The gain of amplifier A2=−(R4/R3)=−6 via amplifier A2's feedback loop. At the amplifier A2 output, the product is (−0.5)(−6) =3. This output converts to a 3 mA current that adds to the quiescent (bias) current of the ASIC via cable 15 and is seen by the status decoder 31 of PSEU 10. There are a number of ratiometric (division) operations here to cancel out the process variations, and minimize variations of supply voltages as well.

While systems and methods for ratiometric proximity sensing have been described with reference to particular embodiments, it will be understood by those skilled in the art that various changes may be made and equivalents may be substituted for elements thereof without departing from the scope of the teachings herein. In addition, many modifications may be made to adapt a particular situation to the teachings herein without departing from the essential scope thereof. Therefore, it is intended that the claims set forth hereinafter not be limited to the disclosed embodiments.

As used herein, the term "computer system" should be construed broadly to encompass a system having at least one computer or processor, and which may have multiple computers or processors that are communicatively coupled by means of a network or bus. As used in the preceding sentence, the terms "computer" and "processor" both refer to devices comprising a processing unit (e.g., a central processing unit) and some form of memory (e.g., non-transitory tangible computer-readable storage medium) for storing a program which is readable by the processing unit.

At least a part of the method described herein may be encoded as executable instructions embodied in a non-transitory tangible computer-readable storage medium, including, without limitation, a storage device and/or a memory device. Such instructions, when executed by a processor or computer, cause the processor or computer to perform at least a portion of the method described herein.

The method claims set forth hereinafter should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the method claims be construed to exclude any portions of two or more steps being performed concurrently or alternatingly unless the claim language explicitly states a condition that precludes such an interpretation.

The invention claimed is:

1. A method for ratiometric proximity sensing comprising:
   supplying a supply voltage to a sensor via a sensor supply line;
   energizing a sensing coil of the sensor;
   measuring the supply voltage while the sensing coil is energized;
   measuring a sensor current while the sensing coil is energized;
   dividing the measured sensor current by the measured supply voltage to produce a signal representing a quotient;
   scaling the supply current of the sensor supply line by the quotient to produce a scaled supply current;
   monitoring the scaled supply current; and
   decoding a status of the sensor in dependence on the magnitude of the scaled supply current.

2. The method as recited in claim 1, further comprising adjusting the sensor current to compensate for variations in a temperature of the sensing coil before the sensor current is measured.

3. The method as recited in claim 1, further comprising determining an actuation status of the sensor based on results of the decoding.

4. The method as recited in claim 3, further comprising responding to the actuation status of the sensor by controlling a function.

5. The method as recited in claim 4, wherein the function is controlled by a flight control system of an aircraft.

6. The method as recited in claim 1, further comprising determining a health status of the sensor based on results of the decoding.

7. The method as recited in claim 6, further comprising recording the health status of the sensor in a non-transitory tangible computer-readable storage medium.

8. The method as recited in claim 7, wherein the recording is performed by an aircraft health monitoring system.

9. A system for ratiometric proximity sensing comprising a sensor and an electronics unit configured to supply a supply voltage to the sensor and monitor a sensor current of the sensor, wherein the sensor comprises:
   a supply circuit that is supplied with the supply voltage;
   a sensor coil that is connected to receive current from the supply circuit;
   current scaling circuitry that is configured for dividing the measured sensor current by the measured supply voltage to produce a signal representing a quotient and then scaling the supply current of the sensor supply line by the quotient to produce a scaled sensor current; and
   a current setting circuit configured to provide the scaled sensor current to the supply circuit.

10. The system as recited in claim 9, wherein the electronics unit is configured to monitor the scaled supply current and decode a status of the sensor in dependence on a magnitude of the scaled supply current.

11. The system as recited in claim 10, wherein the electronics unit is further configured to determine an actuation status of the sensor based on results of the decoding.

12. The system as recited in claim 11, further comprising a flight control system that is configured to respond to the actuation status of the sensor by controlling equipment onboard an aircraft.

13. The system as recited in claim 10, wherein the electronics unit is further configured to determine a health status of the sensor based on results of the decoding.

14. The system as recited in claim 13, further comprising a non-transitory tangible computer-readable storage medium and an aircraft health monitoring system which is configured to record the health status of the sensor in the non-transitory tangible computer-readable storage medium.

15. The system as recited in claim 9, further comprising a temperature compensation circuit that is configured to adjust the sensor current to compensate for variations in a temperature of the sensing coil.

16. The system as recited in claim 9, wherein the current scaling circuitry comprises:
   first through fourth resistors;
   a multiplier having first and second inputs and an output, the first input of the multiplier being connected to receive the supply voltage;
   a first amplifier having first and second inputs and an output, the output of the first amplifier being connected to the second input of the multiplier and to the third resistor, and the first input of the first amplifier being connected to receive the sensor current via the first resistor and to receive a signal from the output of the multiplier via the second resistor; and
   a second amplifier having first and second inputs and an output, the first input of the second amplifier being connected to the third resistor via a first junction, and the output of the second amplifier being connected to the current setting circuit via a second junction, wherein the fourth resistor bridges the first and second junctions.

17. The system as recited in claim 16, further comprising a temperature compensation circuit that is configured to adjust the sensor current to compensate for variations in a temperature of the sensing coil, wherein the first resistor is connected to an output of the temperature compensation circuit.

18. A sensor comprising:
   a supply circuit that is supplied with the supply voltage;
   a reference circuit that is connected to receive power from the supply circuit;
   a sensor coil that is connected to receive current from the supply circuit;

current scaling circuitry that is configured for dividing the measured sensor current by the measured supply voltage to produce a signal representing a quotient and then scaling the supply current of the sensor supply line by the quotient to produce a scaled sensor current; and a current setting circuit configured to receive a reference current from the reference circuit and provide the scaled sensor current to the supply circuit.

19. The sensor as recited in claim 18, wherein the current scaling circuitry comprises:

first through fourth resistors;

a multiplier having first and second inputs and an output, the first input of the multiplier being connected to receive the supply voltage;

a first amplifier having first and second inputs and an output, the output of the first amplifier being connected to the second input of the multiplier and to the third resistor, and the first input of the first amplifier being connected to receive the sensor current via the first resistor and to receive a signal from the output of the multiplier via the second resistor; and a second amplifier having first and second inputs and an output, the first input of the second amplifier being connected to the third resistor via a first junction, and the output of the second amplifier being connected to the current setting circuit via a second junction, wherein the fourth resistor bridges the first and second junctions.

20. The sensor as recited in claim 19, further comprising a temperature compensation circuit that is configured to adjust the sensor current to compensate for variations in a temperature of the sensing coil, wherein the first resistor is connected to an output of the temperature compensation circuit.

* * * * *